(12) United States Patent
Shoyama et al.

(10) Patent No.: US 10,340,400 B2
(45) Date of Patent: Jul. 2, 2019

(54) PHOTOELECTRIC CONVERSION DEVICE, METHOD OF MANUFACTURING THE SAME, AND CAMERA

(71) Applicant: CANON KABUSHIKI KAISHA, Tokyo (JP)

(72) Inventors: Toshihiro Shoyama, Kawasaki (JP); Hiroshi Takakusagi, Atsugi (JP); Tasuku Kaneda, Kawasaki (JP); Toshiyuki Ogawa, Abiko (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 15/825,443

(22) Filed: Nov. 29, 2017

(65) Prior Publication Data

US 2018/0166591 A1 Jun. 14, 2018

(30) Foreign Application Priority Data

Dec. 8, 2016 (JP) ................................. 2016-238781

(51) Int. Cl.
*H01L 31/0288* (2006.01)
*H01L 31/103* (2006.01)
(Continued)

(52) U.S. Cl.
CPC .... *H01L 31/0288* (2013.01); *H01L 21/02381* (2013.01); *H01L 21/02532* (2013.01); *H01L 21/02658* (2013.01); *H01L 21/04* (2013.01); *H01L 21/0415* (2013.01); *H01L 21/203* (2013.01); *H01L 27/146* (2013.01); *H01L 31/103* (2013.01); *H04N 5/367* (2013.01); *H04N 5/369* (2013.01); *H04N 5/378* (2013.01); *Y02E 10/50* (2013.01)

(58) Field of Classification Search
CPC ............. H01L 31/0288; H01L 21/0415; H01L 21/203
See application file for complete search history.

(56) References Cited

U.S. PATENT DOCUMENTS 5,734,195 A 3/1998 Takizawa et al.
5,874,348 A 2/1999 Takizawa et al.
(Continued)

FOREIGN PATENT DOCUMENTS

JP 6-342798 A 12/1994
JP 10-041311 A 2/1998
(Continued)

*Primary Examiner* — Christine A Enad
(74) *Attorney, Agent, or Firm* — Venable LLP

(57) ABSTRACT

A photoelectric conversion device has a silicon substrate which includes a first portion configured to perform photoelectric conversion, and a second portion which is arranged farther apart from a light receiving surface of the silicon substrate than the first portion and contains carbon. A first peak concentration as a carbon peak concentration in the second portion is not less than $1\times10^{18}$ [atoms/cm$^3$] and not more than $1\times10^{20}$ [atoms/cm$^3$], and a second peak concentration as an oxygen peak concentration in the second portion is not less than $1/1000$ and not more than $1/10$ of the first peak concentration.

30 Claims, 11 Drawing Sheets

(51) Int. Cl.
*H01L 21/02* (2006.01)
*H01L 21/04* (2006.01)
*H01L 21/203* (2006.01)
*H01L 27/146* (2006.01)
*H04N 5/378* (2011.01)
*H04N 5/367* (2011.01)
*H04N 5/369* (2011.01)

(56) References Cited

U.S. PATENT DOCUMENTS

| | | | |
|---|---|---|---|
| 6,140,213 A | 10/2000 | Takizawa et al. | |
| 6,746,939 B2 * | 6/2004 | Shimozono | H01L 27/14683 |
| | | | 148/33.2 |
| 8,101,999 B2 * | 1/2012 | Takizawa | H01L 21/26506 |
| | | | 257/347 |
| 8,531,000 B2 | 9/2013 | Yoneda | |
| 9,704,909 B2 | 7/2017 | Kaneda | |
| 2015/0349013 A1 * | 12/2015 | Shoyama | H01L 27/14636 |
| | | | 348/308 |
| 2016/0365462 A1 | 12/2016 | Shoyama et al. | |

FOREIGN PATENT DOCUMENTS

| | | | |
|---|---|---|---|
| JP | 2001-177086 A | 6/2001 | |
| JP | 2002-134511 A | 5/2002 | |
| JP | 2002-353434 A | 12/2002 | |
| JP | 3941075 B2 | 7/2007 | |
| JP | 2010-114409 A | 5/2010 | |
| JP | 2010-258083 A | 11/2010 | |
| JP | 4613886 B2 | 1/2011 | |
| JP | 2014-099481 A | 5/2014 | |
| JP | 2016-119411 A | 6/2016 | |
| JP | 2016-184624 A | 10/2016 | |

\* cited by examiner

FIG. 12
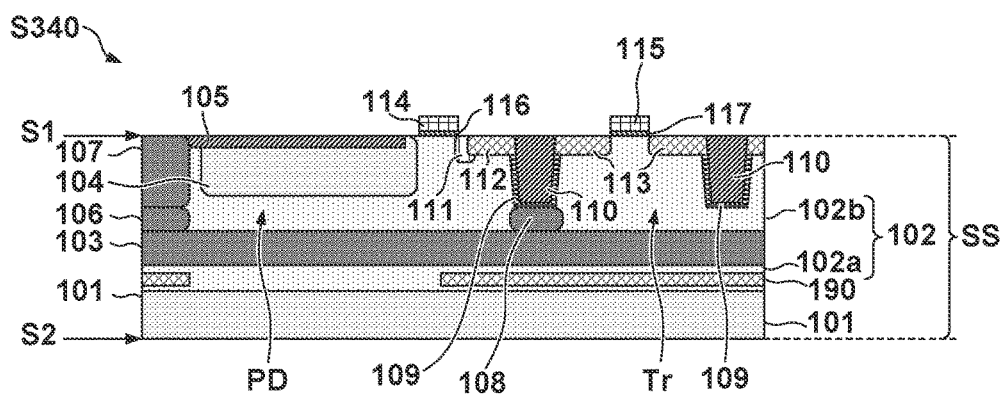
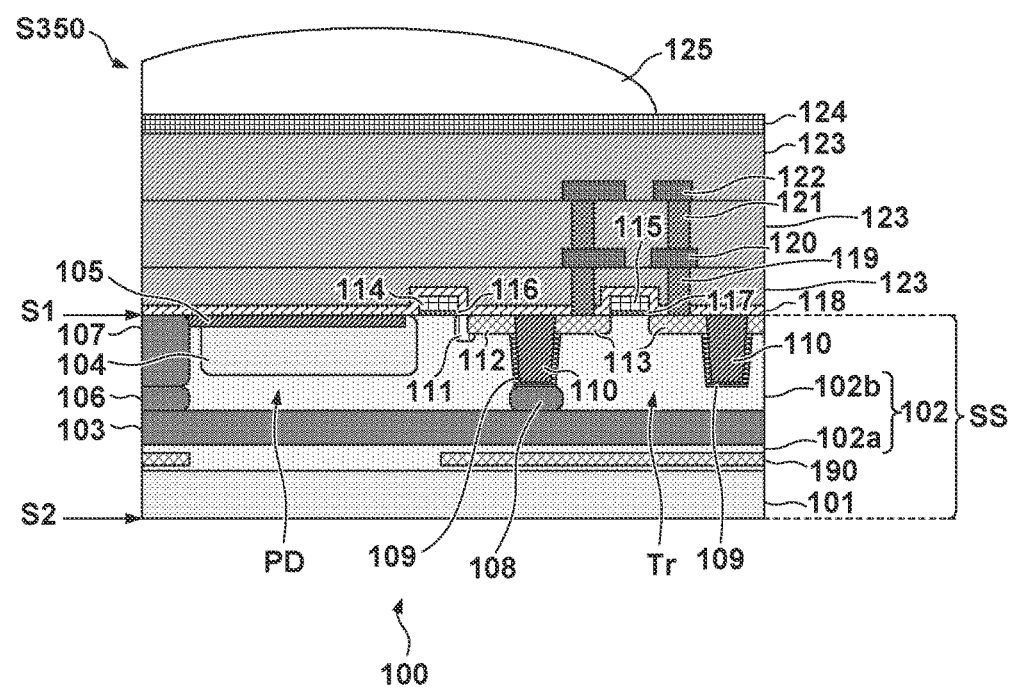

PHOTOELECTRIC CONVERSION DEVICE, METHOD OF MANUFACTURING THE SAME, AND CAMERA

BACKGROUND OF THE INVENTION

Field of the Invention

The present invention relates to a photoelectric conversion device, a method of manufacturing the same, and a camera.

Description of the Related Art

If a metal impurity is mixed into a pixel portion in the manufacturing process of a solid-state image sensor, an increase in dark current of a photoelectric conversion element and occurrence of a white defect are caused. Mixture of the metal impurity into the pixel portion can be caused not only by a manufacturing apparatus but also by thermal diffusion of a silicide material used for a peripheral circuit portion. Japanese Patent Laid-Open No. 10-41311 is related to a gettering technique in a solid-state image sensing element. Japanese Patent Laid-Open No. 10-41311 describes obtaining a gettering capability by ion-implanting carbon and oxygen in a silicon substrate. Japanese Patent Laid-Open No. 10-41311 also describes that it is desirable that an oxygen peak concentration is set equal to or higher than a carbon peak concentration, and oxygen and carbon are made equal to each other in projection range after ion implantation in order to obtain a strong gettering capability by effectively forming a compound of oxygen and carbon.

However, if oxygen is implanted in the silicon substrate intentionally, oxygen that diffuses into an epitaxial layer in an annealing process or the like during the manufacturing process increases. This may induce a crystal defect owing to oxygen in a region close to a pixel. In particular, when a metal such as Co or Ni whose diffusion rate is high in silicon in a low temperature is used, it is desirable that the crystal defect in the epitaxial layer close to the pixel is suppressed, and the metal is captured in a gettering layer formed in the region as deep as possible.

If an oxygen concentration in the silicon substrate is high, or if oxygen is ion-implanted intentionally in the silicon substrate, it is considered that not the metal to be captured but oxygen is gettered in a large amount due to a distortion caused by arranging carbon at the lattice position of silicon. This means that the effect of gettering the metal decreases. For the above-described reasons, it cannot be said that the conventional gettering technique is optimal as a method of reducing a white defect failure of the solid-state image sensor.

SUMMARY OF THE INVENTION

The present invention provides a technique advantageous in suppressing occurrence of a white defect.

One of aspect of the present invention provides a photoelectric conversion device that includes a silicon substrate, wherein the silicon substrate includes a first portion configured to perform photoelectric conversion, and a second portion which is arranged farther apart from a light receiving surface of the silicon substrate than the first portion and contains carbon, a first peak concentration as a carbon peak concentration in the second portion is not less than $1\times10^{18}$ [atoms/cm$^3$] and not more than $1\times10^{20}$ [atoms/cm$^3$], and a second peak concentration as an oxygen peak concentration in the second portion is not less than $\frac{1}{1000}$ and not more than $\frac{1}{10}$ of the first peak concentration.

Further features of the present invention will become apparent from the following description of exemplary embodiments with reference to the attached drawings.

BRIEF DESCRIPTION OF THE DRAWINGS

FIG. 12 is a sectional view for explaining the solid-state image sensor and the method of manufacturing the same according to the third embodiment of the present invention.

DESCRIPTION OF THE EMBODIMENTS

The present invention will now be described with reference to the accompanying drawings by way of exemplary embodiments. A photoelectric conversion device of the present invention can be formed as, for example, a solid-state image sensor, phase difference detection device, light amount sensor, or the like that detects one-dimensional or two-dimensional image information. The solid-state image sensor may be formed as a MOS image sensor, a CCD image sensor, or an image sensor of any other type. An example will be described below in which the photoelectric conversion device of the present invention is applied to the MOS image sensor (solid-state image sensor). However, this does not intend to limit the present invention to the MOS image sensor.

Figure 1:
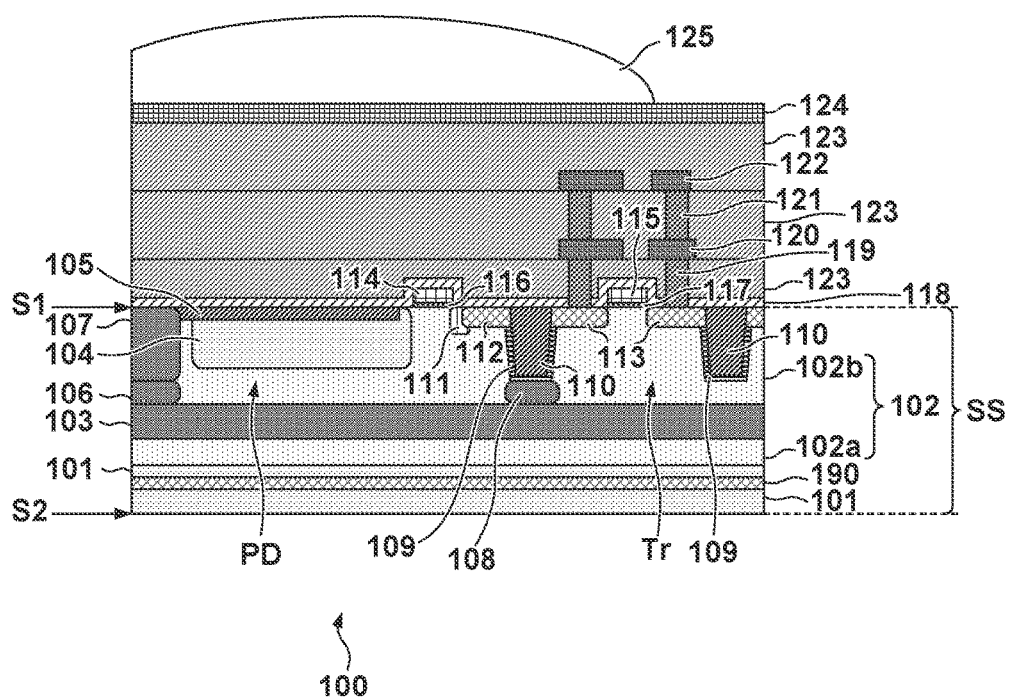
FIG. 1 is a sectional view schematically showing the partial arrangement of a solid-state image sensor according to the first embodiment of the present invention.

FIG. 1 shows the partial arrangement of a solid-state image sensor 100 according to the first embodiment of the present invention. The solid-state image sensor 100 has a semiconductor substrate SS (silicon substrate) including a first semiconductor region 101 and a second semiconductor region 102 arranged on the first semiconductor region 101. The first semiconductor region 101 includes an impurity-containing portion 190. The semiconductor substrate SS has a first surface S1 and a second surface S2 which are surfaces on opposite sides. One of two surfaces of the second semiconductor region 102 opposite to the first semiconductor region 101 forms the first surface S1 of the semiconductor substrate SS. One of two surfaces of the first semiconductor region 101 opposite to the second semiconductor region 102 forms the second surface S2 of the semiconductor substrate SS. The second semiconductor region 102 continues from the first semiconductor region 101. That is, no insulator region exists between the first semiconductor region 101 and the second semiconductor region 102.

In this example, both the first semiconductor region 101 and the second semiconductor region 102 have the first conductivity type. That is, in this example, the first semiconductor region 101 and the second semiconductor region 102 have the same conductivity type. The first semiconductor region 101 and the second semiconductor region 102 may have different conductivity types. A plurality of impurity regions whose conductivity types or impurity concentrations are different from each other are provided in the second semiconductor region 102, as will be described later.

Note that in a description below, the conductivity type of a semiconductor region (impurity region) that makes charges of the same type as signal charges form a majority carrier and makes charges of a different type from the signal charges form a minority carrier will be referred to as the first conductivity type. Then, the conductivity type of a semiconductor region (impurity region) that makes charges of a different type form the signal charges form a majority carrier and makes charges of the same type as the signal charges form a minority carrier will be referred to as the second conductivity type. For example, if electrons are the signal charges, the first conductivity type is an n type, and the second conductivity type is a p type.

The concentration of an impurity of the first conductivity type in the first semiconductor region 101 is different from the concentration of an impurity of the first conductivity type in the second semiconductor region 102. In one example, the concentration of the impurity of the first conductivity type in the first semiconductor region 101 is higher than the concentration of the impurity of the first conductivity type in the second semiconductor region 102. In another example, the concentration of the impurity of the first conductivity type in the first semiconductor region 101 is lower than the concentration of the impurity of the first conductivity type in the second semiconductor region 102.

The first semiconductor region 101 can be formed by a single crystal silicon wafer (silicon plate). More specifically, the first semiconductor region 101 can be formed by a single crystal silicon wafer formed by slicing a single crystal silicon ingot and polishing the slice. The second semiconductor region 102 is made of single crystal silicon, and can be formed by epitaxially growing a single crystal silicon layer on the first semiconductor region 101. The single crystal silicon layer formed by epitaxial growth is called an epitaxial layer. Since a crystal lattice can continue between the first semiconductor region 101 and the second semiconductor region 102, it may be impossible to observe a clear interface.

The semiconductor substrate SS that forms the solid-state image sensor 100 can include a photoelectric converter PD as the first portion which performs photoelectric conversion, and the impurity-containing portion 190 as the second portion which is arranged farther apart from the light receiving surface of the semiconductor substrate SS than the photoelectric converter PD and contains a group 14 element other than silicon. The impurity-containing portion 190 (second portion) contains the group 14 element (impurity) other than silicon (Si) and oxygen (O). Note that the group 14 element includes carbon (C), silicon (Si), germanium (Ge), tin (Sn), and lead (Pb). Carbon (C) smaller in atomic number than silicon (Si) is preferable as the group 14 element other than silicon. The first peak concentration as a peak concentration of the group 14 element other than silicon in the impurity-containing portion 190 (second portion) can be $1\times10^{18}$ [atoms/cm$^3$] or more and $1\times10^{20}$ [atoms/cm$^3$] or less. The second peak concentration as an oxygen peak concentration in the impurity-containing portion 190 (second portion) can be $\frac{1}{1000}$ or more and $\frac{1}{10}$ or less of the first peak concentration (the peak concentration of $1\times10^{18}$ [atoms/cm$^3$] or more and $1\times10^{20}$ [atoms/cm$^3$] or less). The solid-state image sensor 100 manufactured by using the above-described semiconductor substrate SS is advantageous in reducing white spots. The solid-state image sensor 100 manufactured by using the above-described semiconductor substrate SS is also advantageous in reducing after-images in the photoelectric converter PD.

Light enters the photoelectric converter PD via the first surface S1. The impurity-containing portion 190 is arranged apart from the light receiving surface of the semiconductor substrate SS. The light receiving surface can be defined as a portion of the first surface S1 of the semiconductor substrate SS positioned above the photoelectric converter PD. The impurity-containing portion 190 can be arranged in isolation from the photoelectric converter PD. However, a distance between the impurity-containing portion 190 and the photoelectric converter PD can be less than 20 μm. The photoelectric converter PD (first portion) can be arranged between the impurity-containing portion 190 (second portion) and the light receiving surface (first surface S1) in a direction perpendicular to the light receiving surface. The impurity-containing portion 190 can be arranged so as to form a layer parallel to the first surface S1. The impurity-containing portion 190 can be arranged such that a depth from the first surface S1 (a distance from the light receiving surface) falls within a range of 3 μm to 20 μm. In one example, the impurity-containing portion 190 includes a region (first region) with the concentration of an impurity (the group 14 element other than silicon) being $1\times10^{18}$ [atoms/cm$^3$] or more, and the dimension of the region in the direction perpendicular to the first surface S1 (light receiving surface) can be 3 μm or less.

In this example, the impurity-containing portion 190 is arranged in the first semiconductor region 101. However, the impurity-containing portion 190 may be arranged in, for example, an impurity region 102a. The photoelectric converter PD is arranged in at least the second semiconductor region 102. In this example, the photoelectric converter PD is arranged in the second semiconductor region 102. However, the photoelectric converter PD can be extended to the first semiconductor region 101. The photoelectric converter PD includes an impurity region 104 of the first conductivity type capable of functioning as a charge accumulation region. In the impurity region 104 of the first conductivity type, signal charges form the majority carrier. The photoelectric converter PD can also include, between the impurity region 104 and the first semiconductor region 101, an impurity region 103 having the second conductivity type different from the first conductivity type. The photoelectric converter PD can also include, under the impurity region 104, an impurity region 102b of the first conductivity type arranged continuously from the impurity region 104. A portion arranged under the impurity region 103 out of the second semiconductor region 102 is the impurity region 102a. A portion arranged on the impurity region 103 out of the second semiconductor region 102 is the impurity region 102b.

The concentration of the impurity of the first conductivity type in the impurity region 104 is higher than the concentration of the impurity in the second semiconductor region 102 (the impurity regions 102a and 102b). The impurity regions 104, 102b, and 103 form the photoelectric converter PD. Out of negative charges (electrons) and positive charges (holes) generated by photoelectric conversion of the photoelectric converter PD, charges of the same type as the majority carrier in the first conductivity type are accumulated in the impurity region 104. The photoelectric converter PD can include an impurity region 105 having the second conductivity type and arranged on the upper side of the impurity region 104, that is, between the impurity region 104 and the surface of the semiconductor substrate SS. The impurity region 105 functions to isolate the impurity region 104 from the surface of the semiconductor substrate SS. The photoelectric converter PD having a buried photodiode structure is thus formed.

Although not illustrated, the solid-state image sensor 100 includes a plurality of impurity regions 104. The plurality of impurity regions 104 can be isolated from each other by impurity regions 106 and 107 of the second conductivity type each functioning as an isolation region based on a potential barrier. The impurity region 103 can be arranged under the array of the plurality of impurity regions 104 so as to spread throughout the region of the array. The solid-state image sensor 100 includes a plurality of pixels. Each pixel includes the photoelectric converter PD including the impurity region 104.

Charges accumulated in the impurity region 104 of the photoelectric converter PD are transferred to an impurity region 112 of the first conductivity type functioning as a floating diffusion region via a channel that is formed in the impurity region 102b when a potential of active level is applied to a gate electrode 114. The impurity region 112 is formed between the surface of the semiconductor substrate SS and the impurity region 102b out of the second semiconductor region 102. The gate electrode 114 is arranged on a gate insulating film 116 on the semiconductor substrate SS. The impurity regions 104 and 112, the gate electrode 114, and the gate insulating film 116 have a MOS transistor structure. An impurity region 111 functioning as a field relaxation region can be arranged so as to be adjacent to the impurity region 112 on a side of the impurity region 112 close to the impurity region 104. The impurity region 111 can have the first conductivity type.

The solid-state image sensor 100 can include a plurality of transistors Tr to output, to a column signal line, a signal corresponding to the charges transferred to the impurity region 112. The plurality of transistors Tr are arranged on the surface side of the semiconductor substrate SS. Each transistor Tr can include impurity regions 113 that form a source and a drain, a gate electrode 115, and a gate insulating film 117. Out of elements including the plurality of transistors Tr and impurity regions 104 (photoelectric conversion elements), elements to be isolated can be isolated by an element isolation portion 110. The element isolation portion 110 can be formed by an insulator having an STI structure or LOCOS structure formed on the surface side of the semiconductor substrate SS. However, the element isolation portion 110 can also be formed by a p-n junction isolation. An impurity region 109 of the second conductivity type is formed around the element isolation portion 110. The impurity region 109 can function as a channel stop or a shield to a dark current generated in the interface between the element isolation portion 110 and the second semiconductor region 102. An impurity region 108 having the second conductivity type can be arranged between the impurity region 109 and the impurity region 103.

Although not shown in FIG. 1, the solid-state image sensor 100 can include a pixel portion that includes a plurality of pixels each including the photoelectric converter PD and a peripheral circuit portion configured to read out signals from the pixels of the pixel portion. The plurality of pixels can be arrayed in the pixel portion so as to form a plurality of rows and a plurality of columns. The peripheral circuit portion can include, for example, a row selecting circuit that selects the rows in the pixel portion, a signal readout circuit that reads out signals from the pixels of each column in the pixel portion, a column selecting circuit that selects the columns in the pixel portion, and the like. The peripheral circuit portion can include a transistor including a silicide region formed by silicide as a compound of a metal and silicon (a constituent material for the semiconductor substrate SS or a constituent material for the gate electrode). The metal that forms silicide can contain at least one of, for example, nickel, cobalt, titanium, molybdenum, and tungsten.

An insulating layer 118, a plurality of insulating layers 123, wiring layers 120 and 122, a contact plug 119, a via plug 121, and the like can be arranged on the semiconductor substrate SS. The insulating layer 118 can function as, for example, an antireflection film and/or an etching stopper. The plurality of insulating layers 123 can function as interlayer dielectric films. A color filter layer 124, a microlens 125, and the like can be arranged on the plurality of insulating layers 123.

Figure 2:
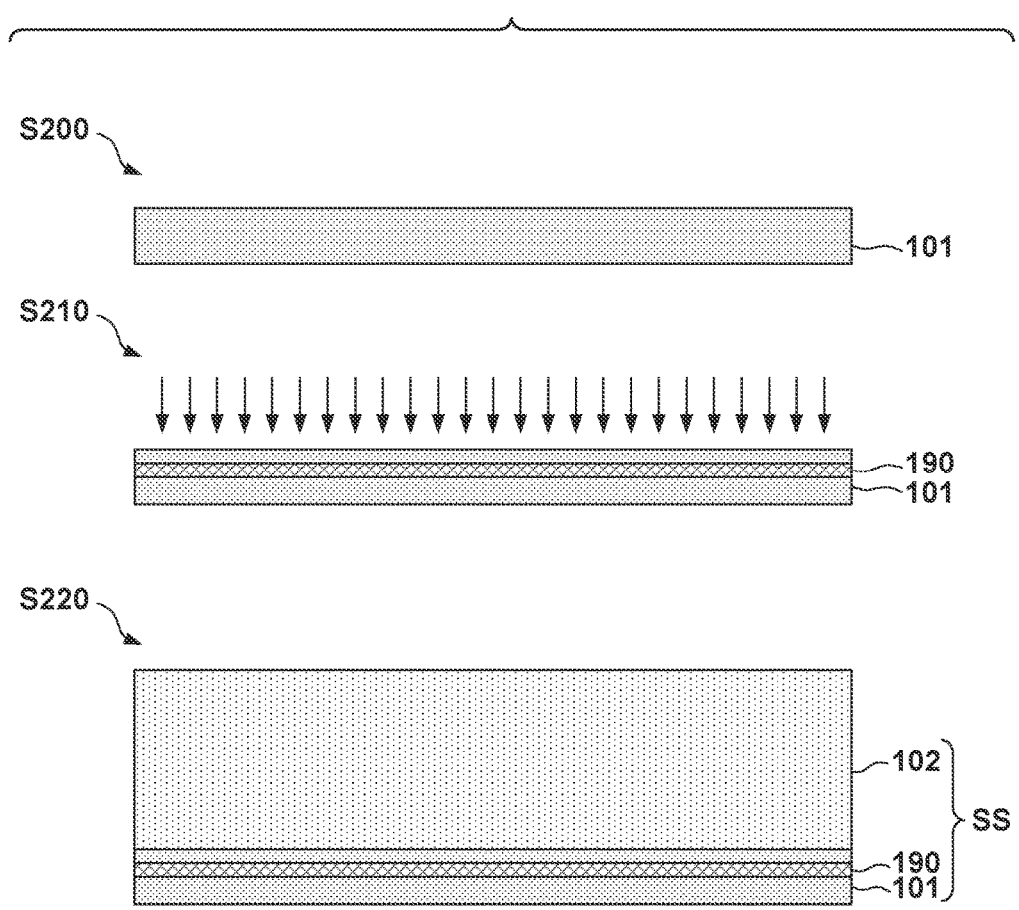
FIG. 2 is a view for explaining a method of manufacturing the solid-state image sensor according to the first embodiment of the present invention.

A method of manufacturing the solid-state image sensor 100 of the first embodiment will be described below with reference to FIG. 2. First, in step S200, a single crystal silicon substrate as the first semiconductor region 101 is prepared by mirror-polishing and cleaning a wafer that is sliced from a single crystal silicon ingot pulled by an MCZ method. Note that oxygen is mixed into silicon while fabricating the ingot. It is possible, however, to control an oxygen concentration in the ingot (resulting first semiconductor region 101) by adjusting a condition such as a rotation speed, applied magnetic field, atmosphere, or the like in pulling. With this adjustment, the oxygen concentration in the ingot (resulting first semiconductor region 101) is controlled to fall within a range of $2\times10^{16}$ [atoms/cm$^3$] or more to $8\times10^{17}$ [atoms/cm$^3$], for example, at $5\times10^{17}$ [atoms/cm$^3$]. The oxygen concentration can be obtained from a conversion factor by Old ASTM.

When the first semiconductor region 101 having the oxygen concentration of $8\times10^{17}$ [atoms/cm$^3$] or less is used, it is possible to suppress the concentration of oxygen captured in the impurity-containing portion 190 to $\frac{1}{10}$ or less of the concentration of the group 14 element other than silicon in the manufactured solid-state image sensor 100. On the other hand, when the first semiconductor region 101 (single crystal silicon substrate) having the oxygen concentration of $2\times10^{16}$ [atoms/cm$^3$] or less is used, a mechanical strength may be decreased, and a yield in the manufacturing process of the solid-state image sensor 100 may be decreased. Note that the dimension (diameter), resistivity, conductivity type, and the like of the first semiconductor region 101 (single crystal silicon substrate) are not particularly limited.

Then, in step S210, an ion implanter is used to accelerate and implant, for example, carbon ions as the group 14 element (impurity) other than silicon in the first semiconductor region 101 (single crystal silicon substrate). Consequently, the impurity-containing portion 190 is formed in the first semiconductor region 101. Carbon implantation can be performed by an ion implantation method of ionizing and implanting carbon. The impurity-containing portion 190 may be formed in the vicinity of the surface of the first semiconductor region 101 or may be formed inside the first semiconductor region 101. Note that in place of carbon, a hydrocarbon molecule that contains carbon may be adopted as an impurity. The purpose of ion implantation is to create a local distortion in silicon by introducing an element which belongs to the same group (group 14) as silicon and different in atomic radius from silicon. Hence, not carbon but germanium, tin, or lead may be implanted in the first semiconductor region 101 (single crystal silicon substrate) as an impurity.

An acceleration energy at the time of ion implantation of the impurity can fall within a range of, for example, 10 KeV to 200 KeV. An implantation dose at the time of ion implantation of the impurity can fall within a range of, for example, $1\times10^{14}$ [atoms/cm$^2$] to $5\times10^{15}$ [atoms/cm$^2$]. Note that if the dose is too low, a gettering effect to be described later decreases. On the other hand, if the dose is too high, the second semiconductor region 102 (epitaxial layer) may be formed on the first semiconductor region 101 which has a crystal defect caused by ion implantation, resulting in forming a crystal defect in the second semiconductor region 102. An impurity dose can be decided such that the concentration of oxygen captured in the impurity-containing portion 190 (gettering layer) becomes 1/10 or less of the concentration of the group 14 element (impurity) other than silicon in the manufactured solid-state image sensor 100.

On the other hand, if the impurity dose is $5\times10^{15}$ [atoms/cm$^2$], and an impurity peak concentration is $10\times10^{19}$ [atoms/cm$^3$], the oxygen peak concentration is desirably higher than $1\times10^{17}$ [atoms/cm$^3$]. This is because the crystal defect in the second semiconductor region 102 or a decrease in mechanical strength of the first semiconductor region 101 caused by a low oxygen concentration may occur if the oxygen peak concentration becomes $1\times10^{17}$ [atoms/cm$^3$] or less. It is therefore desirable that the peak oxygen concentration in the impurity-containing portion 190 is made 1/1000 or more of the impurity peak concentration in the impurity-containing portion 190.

In one example, an arrangement can be adopted in which the oxygen concentration is $2\times10^{17}$ [atoms/cm$^3$] or less in a portion where the photoelectric converter PD is provided, and the oxygen peak concentration is $2\times10^{18}$ [atoms/cm$^3$] or more in a portion deeper than the photoelectric converter PD.

Then, in step S220, the second semiconductor region 102 (epitaxial layer) is formed by epitaxial growth on a surface where the impurity (carbon) of the first semiconductor region 101 (single crystal silicon substrate) is ion-implanted. In one example, the thickness of the second semiconductor region 102 is 9 µm.

The element isolation portion 110, the impurity regions 103, 108, and 109, the photoelectric converter PD, the impurity regions 111, 112, and 113, and the like can be formed in the semiconductor substrate SS below. The gate electrodes 114 and 115, the gate insulating films 116 and 117, the insulating layers 118 and 123, the wiring layers 120 and 122, the contact plug 119, the via plug 121, the color filter layer 124, the microlens 125, and the like can also be formed on the semiconductor substrate SS.

In the above-described manufacturing process, the semiconductor substrate SS undergoes annealing in order to, for example, form an oxide film, activate an impurity, or the like. The maximum temperature in this annealing is typically about 900° C. to 1,100° C. In the process of this annealing, silicon in the semiconductor substrate SS (first semiconductor region 101) is substituted by the impurity such as carbon, and this may cause a local distortion. As a result, the impurity-containing portion 190 functions as a gettering portion or a gettering layer that captures heavy metals such as cobalt and nickel.

In one example, in the manufactured solid-state image sensor 100, the impurity-containing portion 190 includes a region (second region) with an impurity concentration of $1\times10^{19}$ [atoms/cm$^3$] or more, and an oxygen concentration in the region is $3\times10^{18}$ [atoms/cm$^3$] or less. Note that the region with the impurity concentration of $1\times10^{19}$ [atoms/cm$^3$] or more has a distortion caused by substituting silicon with the impurity, and this distortion can capture the heavy metals such as cobalt and nickel in addition to oxygen. The fact that the oxygen concentration in the region is $3\times10^{18}$ [atoms/cm$^3$] or less means that the region has a sufficient capability to capture the heavy metals, that is, a sufficient gettering capability.

Figure 3:
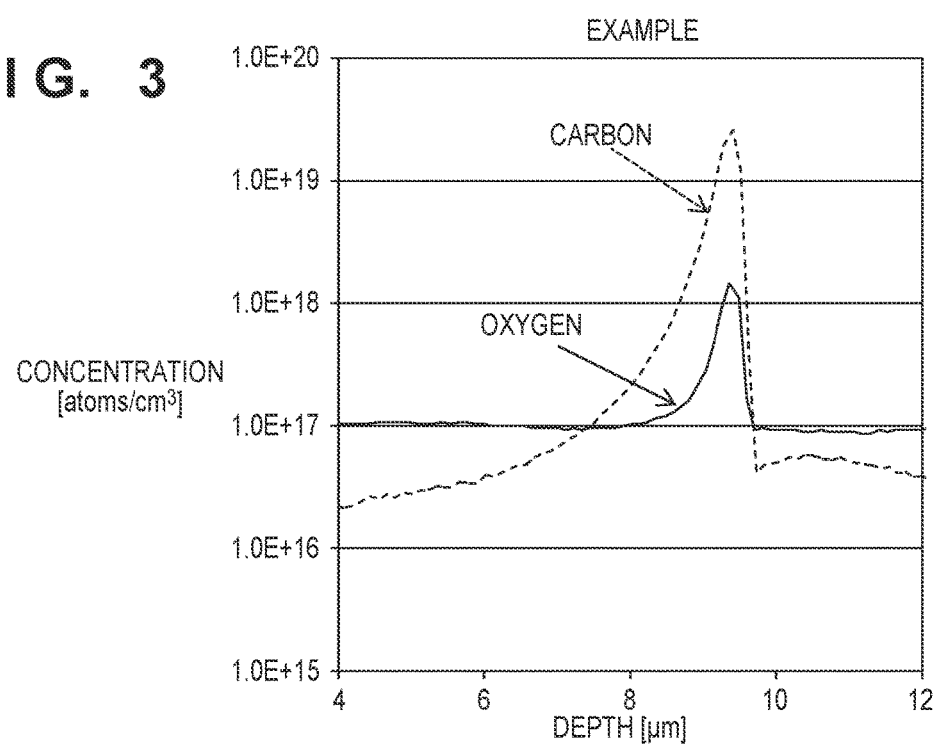
FIG. 3 is a graph showing the concentrations of carbon (impurity) and oxygen in an example of the solid-state image sensor according to the first embodiment of the present invention.
Figure 4:
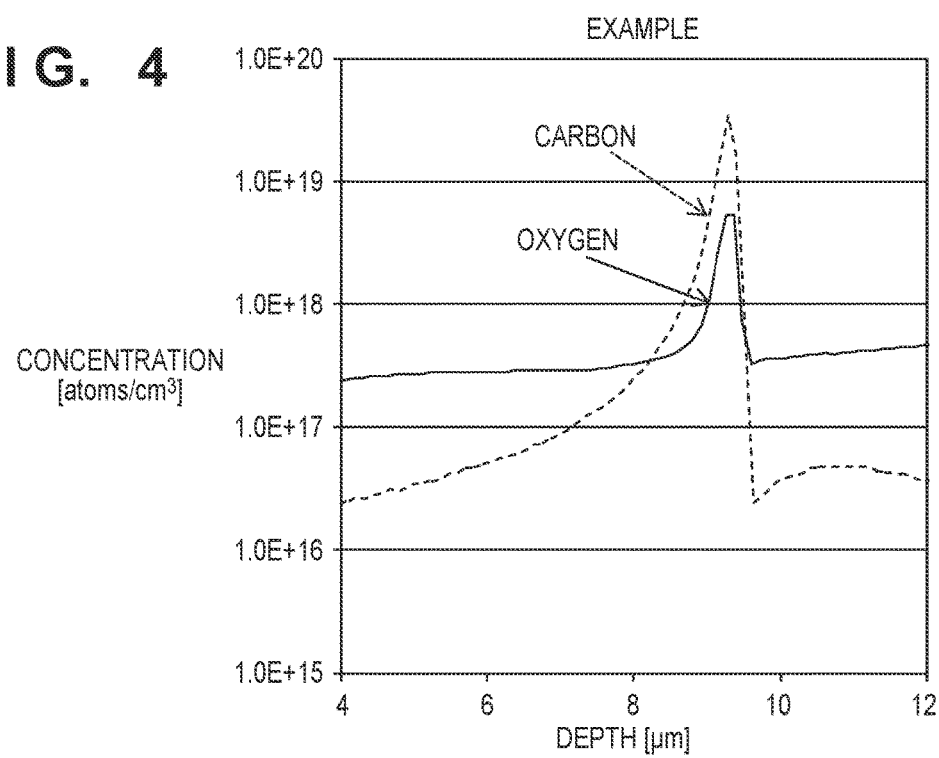
FIG. 4 is a graph showing the concentrations of carbon (impurity) and oxygen in a solid-state image sensor according to a comparative example.

FIG. 3 shows the concentrations of carbon (impurity) and oxygen in a solid-state image sensor according to an example of the present invention. FIG. 4 shows the concentrations of carbon (impurity) and oxygen in a solid-state image sensor according to a comparative example. Note that in the example, a first semiconductor region 101 (single crystal silicon substrate) with an oxygen concentration of $5\times10^{17}$ [atoms/cm$^3$] is prepared in step S200. On the other hand, in the comparative example, a first semiconductor region 101 (single crystal silicon substrate) with an oxygen concentration of $1.3\times10^{18}$ [atoms/cm$^3$] is prepared in step S200. Other conditions are the same in the example and the comparative example. In FIGS. 3 and 4, the abscissa indicates the depth from a first surface S1 of a semiconductor substrate SS. Measurement of the concentrations of carbon and oxygen is performed by SIMS analysis.

From the results of FIGS. 3 and 4, oxygen also exists at a high concentration in a region (impurity-containing portion) where carbon as the impurity is implanted. In addition, in FIGS. 3 and 4, distribution shapes of carbon and oxygen are similar to each other. It is estimated from this that oxygen present between silicon lattices gathers in a distortion caused by carbon. In the example shown in FIG. 3, the first semiconductor region 101 (single crystal silicon substrate) lower in oxygen concentration than the comparative example is used, and thus the amount of oxygen in the region (impurity-containing portion) where carbon is implanted is smaller than in the comparative example in the manufactured solid-state image sensor. As shown in FIGS. 3 and 4, a peak value in an oxygen concentration distribution (to be referred to as an oxygen concentration peak hereinafter) and a peak value in a carbon concentration distribution (to be referred to as a carbon concentration peak) almost match in depth. Therefore, a value obtained by dividing the oxygen peak concentration by the carbon peak concentration is calculated and used as an index of the oxygen concentration in the impurity-containing portion serving as a gettering layer.

Figure 5:
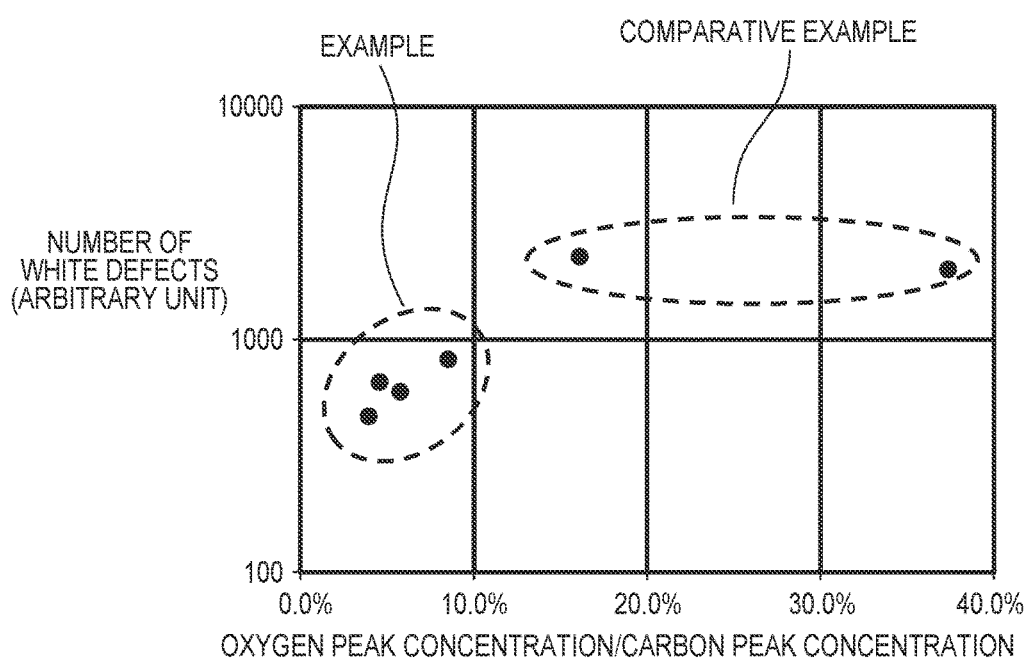
FIG. 5 is a graph plotting the number of white defects in a solid-state image sensor, and an index (oxygen peak concentration/carbon peak concentration) obtained by measuring a semiconductor substrate in the solid-state image sensor according to the example and a comparative example.

FIG. 5 is a graph plotting the number of white defects in the solid-state image sensor and an index (oxygen peak concentration/carbon peak concentration) obtained by measuring the semiconductor substrate SS in the solid-state image sensor according to the example and the comparative example. The number of white defects of the ordinate is a value obtained by operating the solid-state image sensor under a dark environment for a short time and counting the number of pixels each indicating a specific high output value as the number of white detects. As is apparent from FIG. 5, it can be seen that the number of white defects decreases as compared with the comparative example if the oxygen concentration is 1/10 or less (10.0% or less) of the concentration of carbon as the impurity.

FIG. 3 in Japanese Patent Laid-Open No. 10-41311 shows that the number of white defects decreases as an oxygen dose increases. On the other hand, the present inventor found that it is possible to decrease the number of white defects by manufacturing a solid-state image sensor 100 such that an oxygen concentration in an impurity-containing portion 190 becomes 1/10 or less of the impurity concentration in the impurity-containing portion 190 as described above. Both may seem to contradict, and thus this will be described.

Figure 6A:
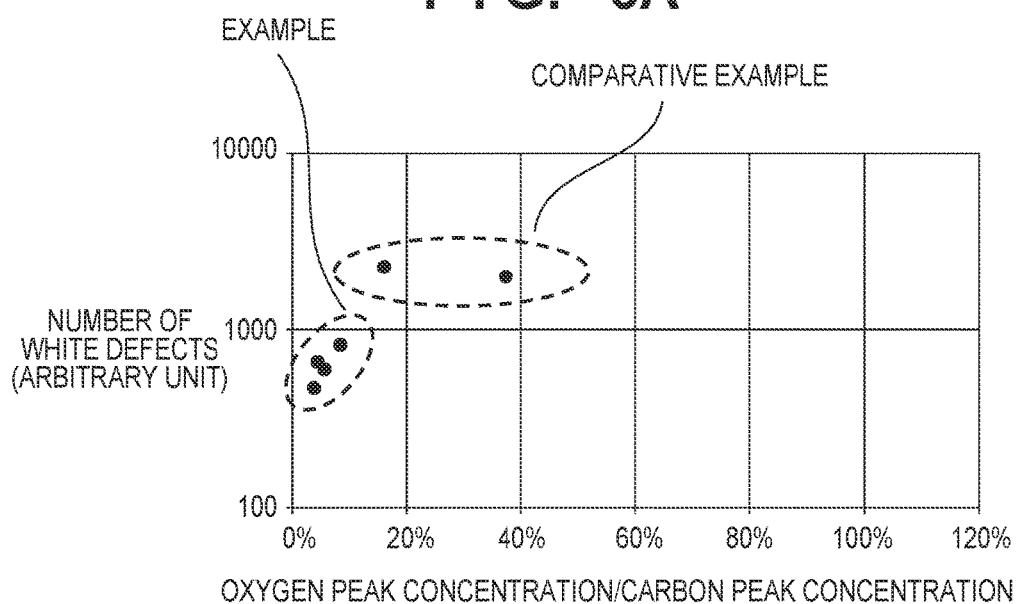
FIG. 6A is a graph obtained by rewriting the abscissa of FIG. 5 into a range of 0% to 120%.
Figure 6B:
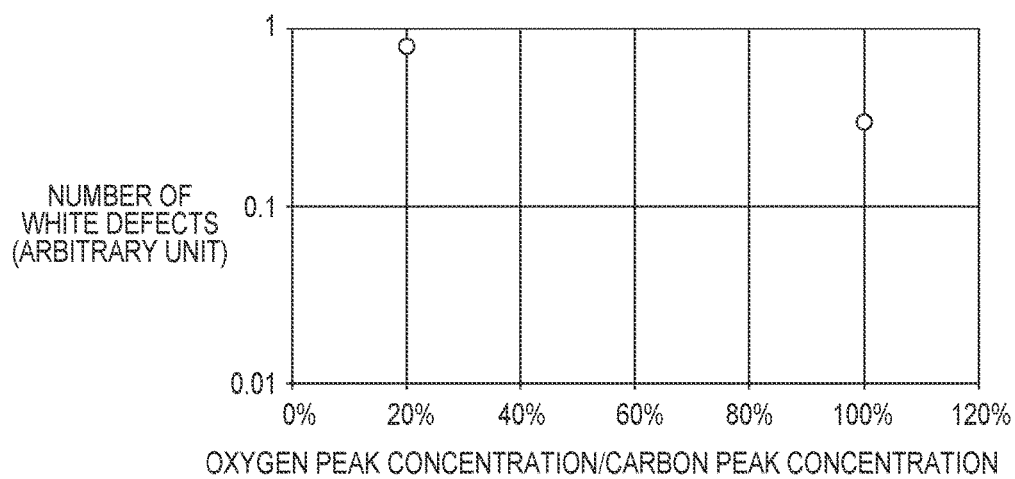
FIG. 6B is a graph plotting two data of FIG. 3 in Japanese Patent Laid-Open No. 10-41311.

FIG. 6A is a graph obtained by rewiring the abscissa of FIG. 5 into a range of 0% to 120%. FIG. 6B is a graph plotting two data of FIG. 3 in Japanese Patent Laid-Open No. 10-41311. One data is obtained when carbon dose=5× $10^{14}$ [atoms/cm$^{-2}$], and oxygen dose=5×$10^{14}$ [atoms/cm$^{-2}$]. The other data is obtained when carbon dose=5×$10^{14}$ [atoms/cm$^{-2}$], and oxygen dose=0 [atoms/cm$^{-2}$]. Note that assuming a substrate having a general oxygen concentration, oxygen peak concentration/carbon peak concentration when oxygen dose=0 [atoms/cm$^{-2}$] is set at 20%. In Japanese Patent Laid-Open No. 10-41311, focus is placed not on the oxygen concentration in the substrate but on the oxygen dose with respect to the substrate. In practice, a general single crystal silicon substrate contains the substantial amount of oxygen, and Japanese Patent Laid-Open No. 10-41311 does not consider this. As can be seen from FIGS. 6A and 6B, the example of the present invention is superior to data described in Japanese Patent Laid-Open No. 10-41311, and then the present invention specifies a parameter which is not assumed in Japanese Patent Laid-Open No. 10-41311.

In a range with a high oxygen concentration, many oxygen precipitation defects are formed not only in the first semiconductor region 101 but also in a second semiconductor region 102 (epitaxial layer), and thus many places each capable of capturing a metal impurity exist other than in the impurity-containing portion 190 where an impurity is implanted. It is therefore estimated that in the range with the high oxygen concentration, the number of white defects decreases by increasing the oxygen precipitation defects. It is estimated, however, that an effect of decreasing the number of white defects by increasing the oxygen precipitation defects is limited. In order to further decrease the number of white defects, the oxygen precipitation defects rather become obstacles, and capturing a metal by a distortion formed by the impurity in the impurity-containing portion 190 is considered more effective. That is, in order to further decrease the number of white defects, controlling the oxygen concentration such that the oxygen concentration in the impurity-containing portion 190 becomes 1/10 or less of the impurity concentration in the impurity-containing portion 190 in the completed solid-state image sensor 100 is considered effective. If oxygen is captured by the distortion formed by the impurity in the impurity-containing portion 190, the capability of the distortion to capture a heavy metal may decrease.

Figure 7:
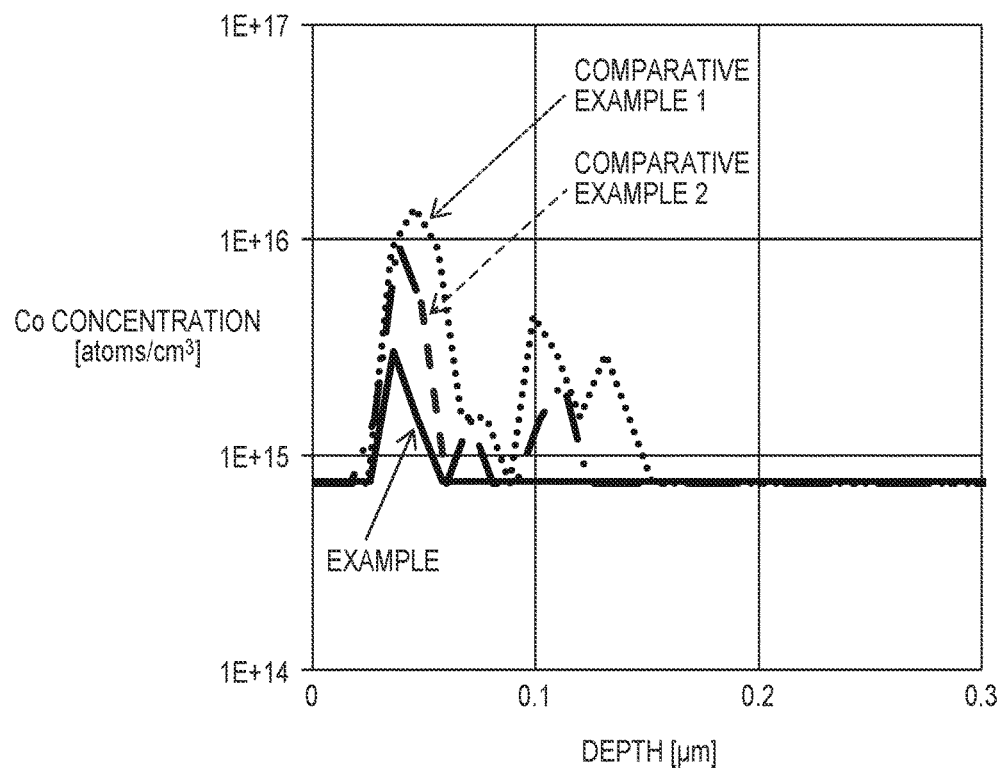
FIG. 7 is a graph showing the concentration distribution of cobalt (Co) near the surface of a pixel region (photoelectric converter PD) in a solid-state image sensor according to each of the example, Comparative Example 1, and Comparative Example 2 of the present invention.

FIG. 7 shows the concentration distribution of cobalt (Co) near the surface of a pixel region (photoelectric converter PD) in a solid-state image sensor according to each of the example, Comparative Example 1, and Comparative Example 2 of the present invention. In FIG. 7, the abscissa indicates a depth from a first surface S1, and the ordinate indicates a cobalt concentration. The example is an example in which oxygen peak concentration/carbon peak concentration=4% is obtained, Comparative Example 1 is an example in which carbon implantation is not performed, and Comparative Example 2 is an example in which oxygen peak concentration/carbon peak concentration=37% is obtained. The example, Comparative Example 1, and Comparative Example 2 are results obtained by manufacturing the solid-state image sensors having the same structure on the same condition from step S220 and evaluating the solid-state image sensors.

It can be seen that the cobalt concentration near the surface of a pixel region (photoelectric converter PD decreases by implanting carbon as the impurity in a first semiconductor region 101 (single crystal silicon substrate). This indicates that an impurity-containing portion 190 provided in a deep portion of a semiconductor substrate SS getters cobalt near the surface of the pixel region (photoelectric converter PD). It is confirmed that by adopting a semiconductor substrate with a low oxygen concentration as in the example (oxygen peak concentration/carbon peak concentration=4%), gettering of cobalt is performed more effectively than in a case in which a semiconductor substrate with a high oxygen concentration is adopted as in Comparative Example 2.

Figure 8:
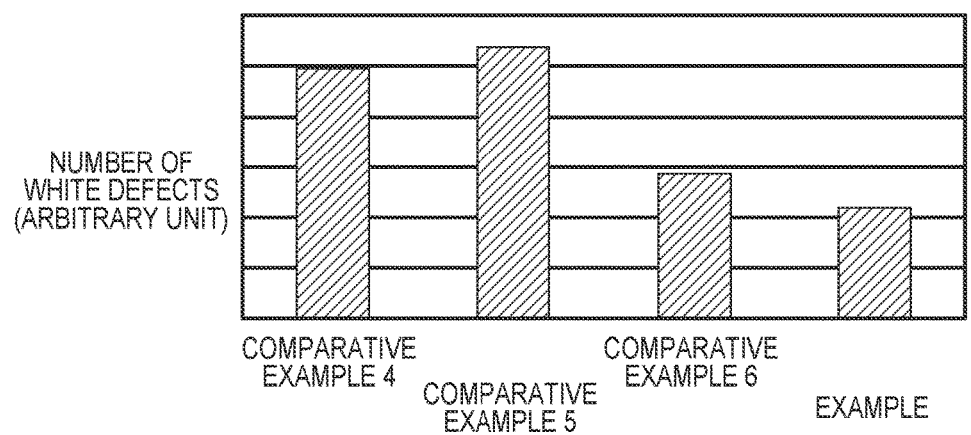
FIG. 8 is a graph showing the number of white defects in a solid-state image sensor according to each of the example, Comparative Example 4, Comparative Example 5, and Comparative Example 6 of the present invention.

FIG. 8 shows the number of white defects in a solid-state image sensor according to each of the example, Comparative Example 4, Comparative Example 5, and Comparative Example 6 of the present invention. In Comparative Example 4, the solid-state image sensor is manufactured by using a semiconductor substrate SS obtained by preparing a first semiconductor region 101 with an oxygen peak concentration exceeding 3×$10^{18}$ [atoms/cm$^3$] and growing a second semiconductor region 102 epitaxially without implanting an impurity (carbon). In Comparative Example 5, the solid-state image sensor is manufactured by using a semiconductor substrate SS obtained by preparing a first semiconductor region 101 with the same oxygen peak concentration as in the example (3×$10^{18}$ [atoms/cm$^3$] or less) and growing a second semiconductor region 102 epitaxially without implanting an impurity (carbon). In Comparative Example 6, the solid-state image sensor is manufactured by using a semiconductor substrate SS obtained by preparing a first semiconductor region 101 with the same oxygen peak concentration as in Comparative Example 4 and growing a second semiconductor region 102 epitaxially after implanting an impurity (carbon).

If implantation of a gettering impurity is not performed, the number of white defects increases by decreasing oxygen concentration (Comparative Examples 4 and 5). It is considered that this is because the gettering effect decreases by decreasing the oxygen precipitation defects as described above. It can be seen that the number of white defects decreases by implanting the impurity as in Comparative Example 6. Then, it can be seen that the number of white defects further decreases by decreasing the oxygen concentration in addition to implanting the impurity as in the example.

A reduction in afterimage in a photoelectric converter PD will be described. The afterimage in the photoelectric converter PD may be caused by emitting signal charges from a level formed by oxygen sometime after the signal charges are captured in the level. Oxygen that may thus cause the afterimage can be collected in an impurity-containing portion 190 of the semiconductor substrate SS and fixed, making it possible to suppress the afterimage in the photoelectric converter PD. In particular, diffusion of oxygen from the first semiconductor region 101 to the second semiconductor region 102 can be suppressed in the impurity-containing portion 190, making it possible to decrease an oxygen concentration in the second semiconductor region 102. From this viewpoint, it can be said that an oxygen concentration in the impurity-containing portion 190 is preferably higher to the extent that it does not exceed 1/10 of a peak concentration of a group 14 element other than silicon.

Figure 9:
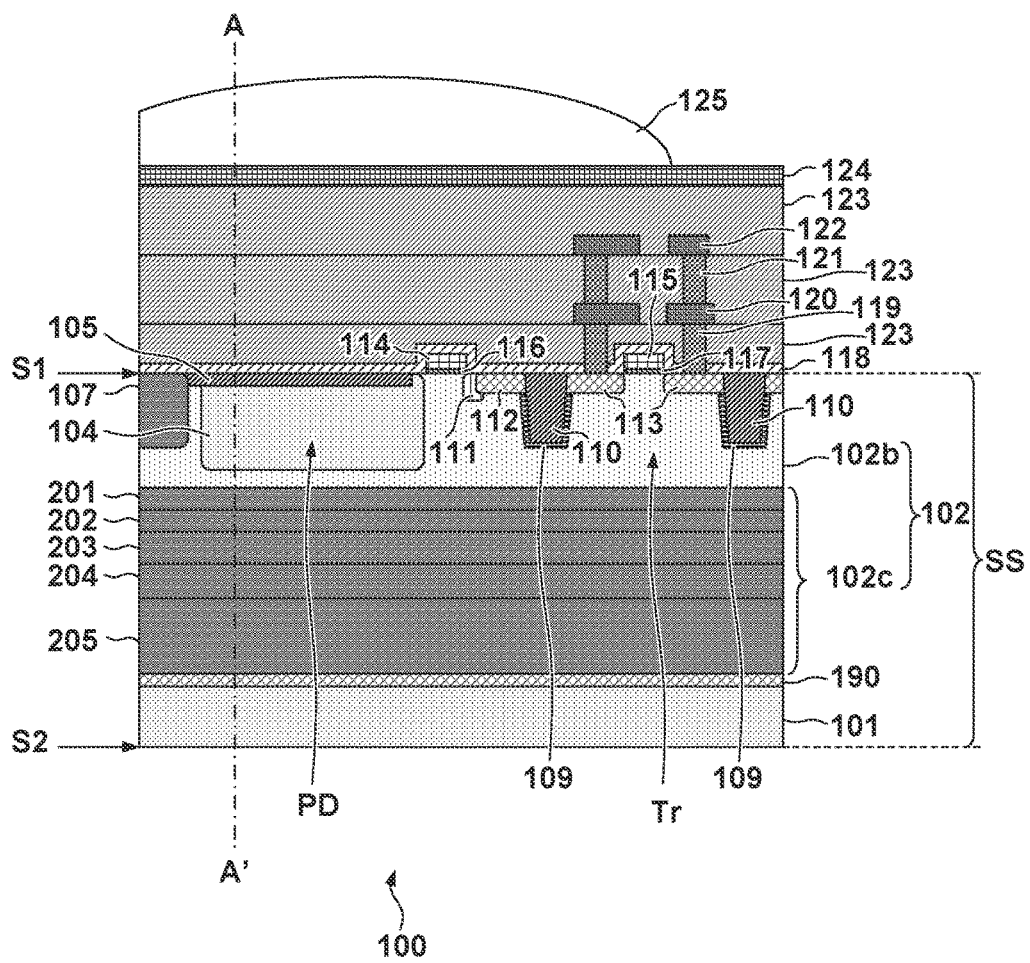
FIG. 9 is a sectional view schematically showing the partial arrangement of a solid-state image sensor according to the second embodiment of the present invention.

FIG. 9 shows the partial arrangement of a solid-state image sensor 100 according to the second embodiment of the present invention. Matters that are not mentioned in the second embodiment can comply with the first embodiment. The solid-state image sensor 100 has a semiconductor substrate SS (silicon substrate) including a first semiconductor region 101 and a second semiconductor region 102 arranged on the first semiconductor region 101. The first semiconductor region 101 includes an impurity-containing portion 190. The semiconductor substrate SS has a first surface S1 and a second surface S2 which are surfaces on opposite sides. One of two surfaces of the second semiconductor region 102 opposite to the first semiconductor region 101 forms the first surface S1 of the semiconductor substrate SS. One of two surfaces of the first semiconductor region 101 opposite to the second semiconductor region 102 forms the second surface S2 of the semiconductor substrate SS. A plurality of impurity regions whose conductivity types or impurity concentrations are different from each other are provided in the second semiconductor region 102.

The first semiconductor region 101 is made of single crystal silicon, and can be formed by slicing a single crystal silicon ingot and polishing the slice. The second semiconductor region 102 is made of single crystal silicon, and can be formed by epitaxially growing a single crystal silicon layer on the first semiconductor region 101. Since a crystal lattice can continue between the first semiconductor region 101 and the second semiconductor region 102, it may be impossible to observe a clear interface. The second semiconductor region 102 includes a semiconductor region 102b of the first conductivity type and a semiconductor region 102c of the second conductivity type.

The impurity-containing portion 190 contains a group 14 element (impurity) other than silicon (Si) and oxygen (O). Note that the group 14 element includes carbon (C), silicon (Si), germanium (Ge), tin (Sn), and lead (Pb). The first peak concentration as a peak concentration of the group 14 element other than silicon in the impurity-containing portion 190 can be $1\times10^{18}$ [atoms/cm$^3$] or more and $1\times10^{20}$ [atoms/cm$^3$] or less. An oxygen peak concentration in the impurity-containing portion 190 can be 1/1000 or more and 1/10 or less of the first peak concentration ($1\times10^{18}$ [atoms/cm$^3$] or more and $1\times10^{20}$ [atoms/cm$^3$] or less). The solid-state image sensor 100 manufactured by using the above-described semiconductor substrate SS is advantageous in reducing white spots.

A photoelectric converter PD is arranged in the semiconductor substrate SS of the solid-state image sensor 100. The impurity-containing portion 190 is arranged in isolation from the photoelectric converter PD. The photoelectric converter PD is arranged between the impurity-containing portion 190 and the first surface S1. The impurity-containing portion 190 can be arranged so as to form a layer parallel to the first surface S1.

The photoelectric converter PD includes an impurity region 104 of the first conductivity type capable of functioning as a charge accumulation region. In the impurity region 104 of the first conductivity type, signal charges form the majority carrier. The photoelectric converter PD can also include, between the impurity region 104 and the first semiconductor region 101, the impurity region 102c of the second conductivity type. The impurity region 102c can include a plurality of semiconductor regions 201, 202, 203, 204, and 205 of the second conductivity type. The photoelectric converter PD can include, under the impurity region 104, the impurity region 102b of the first conductivity type arranged continuously from the impurity region 104. The concentration of the impurity of the first conductivity type in the impurity region 104 is higher than the concentration of the impurity of the first conductivity type in the impurity region 102b. The impurity regions 104, 102b, and 102c form the photoelectric converter PD.

Out of negative charges (electrons) and positive charges (holes) generated by photoelectric conversion of the photoelectric converter PD, charges of the same type as the majority carrier in the first conductivity type are accumulated in the impurity region 104. The photoelectric converter PD can include an impurity region 105 having the second conductivity type and arranged on the upper side of the impurity region 104, that is, between the impurity region 104 and the surface of the semiconductor substrate SS. The impurity region 105 functions to isolate the impurity region 104 from the surface of the semiconductor substrate SS. The photoelectric converter PD having a buried photodiode structure is thus formed.

Figure 10:
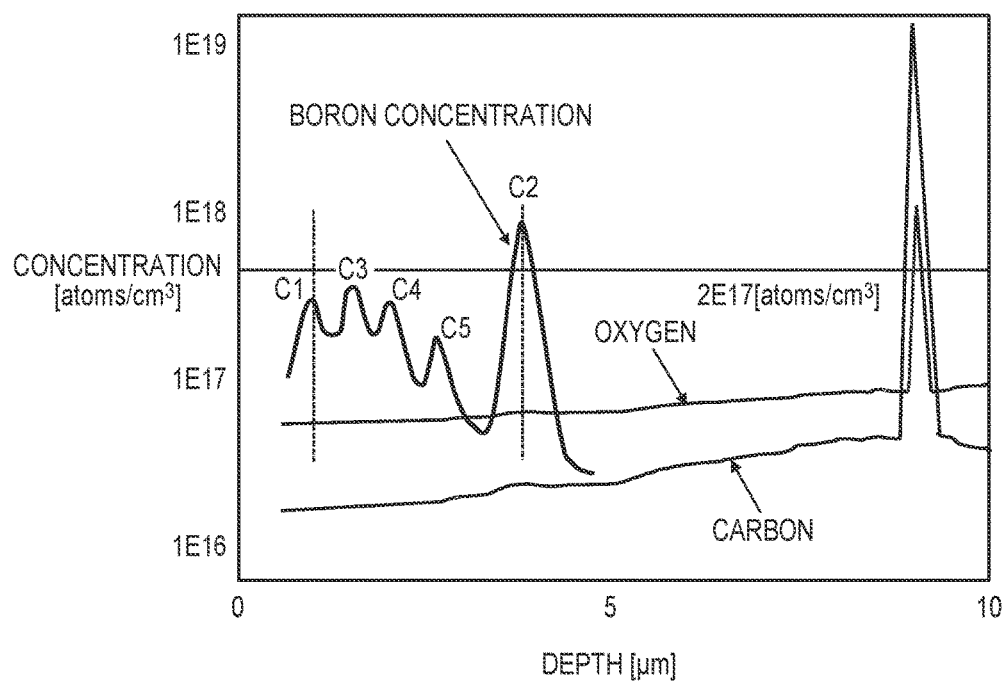
FIG. 10 is a graph showing the concentration of an impurity of the second conductivity type (p type), the concentration of oxygen, and the concentration of an impurity (carbon) taken along a line A-A' in FIG. 9.

FIG. 10 shows the concentration of an impurity of the second conductivity type (p type here), the concentration of oxygen, and the concentration of an impurity (carbon) taken along a line A-A' in FIG. 9. A depth indicates a depth from the first surface S1 of the semiconductor substrate SS. C1 indicates a peak of an impurity of the second conductivity type in the semiconductor region 201. C3 indicates a peak of the impurity of the second conductivity type in the semiconductor region 202. C4 indicates a peak of the impurity of the second conductivity type in the semiconductor region 203. C5 indicates a peak of the impurity of the second conductivity type in the semiconductor region 204. C2 indicates a peak of the impurity of the second conductivity type in the semiconductor region 205. A depth where a carbon concentration has a peak and a depth where an oxygen concentration indicates a peak are positioned within the depth range of the impurity-containing portion 190. The semiconductor substrate SS has an oxygen concentration of $2\times10^{17}$ [atoms/cm$^3$] or less when at least a depth from the first surface S1 falls within a range of 0 to 15 μm. In an example shown in FIG. 10, the oxygen concentration has a peak of $2\times10^{18}$ [atoms/cm$^3$] or more at a position deeper than a depth where the concentration of the impurity of the second conductivity type has the peak C2.

Figure 11:
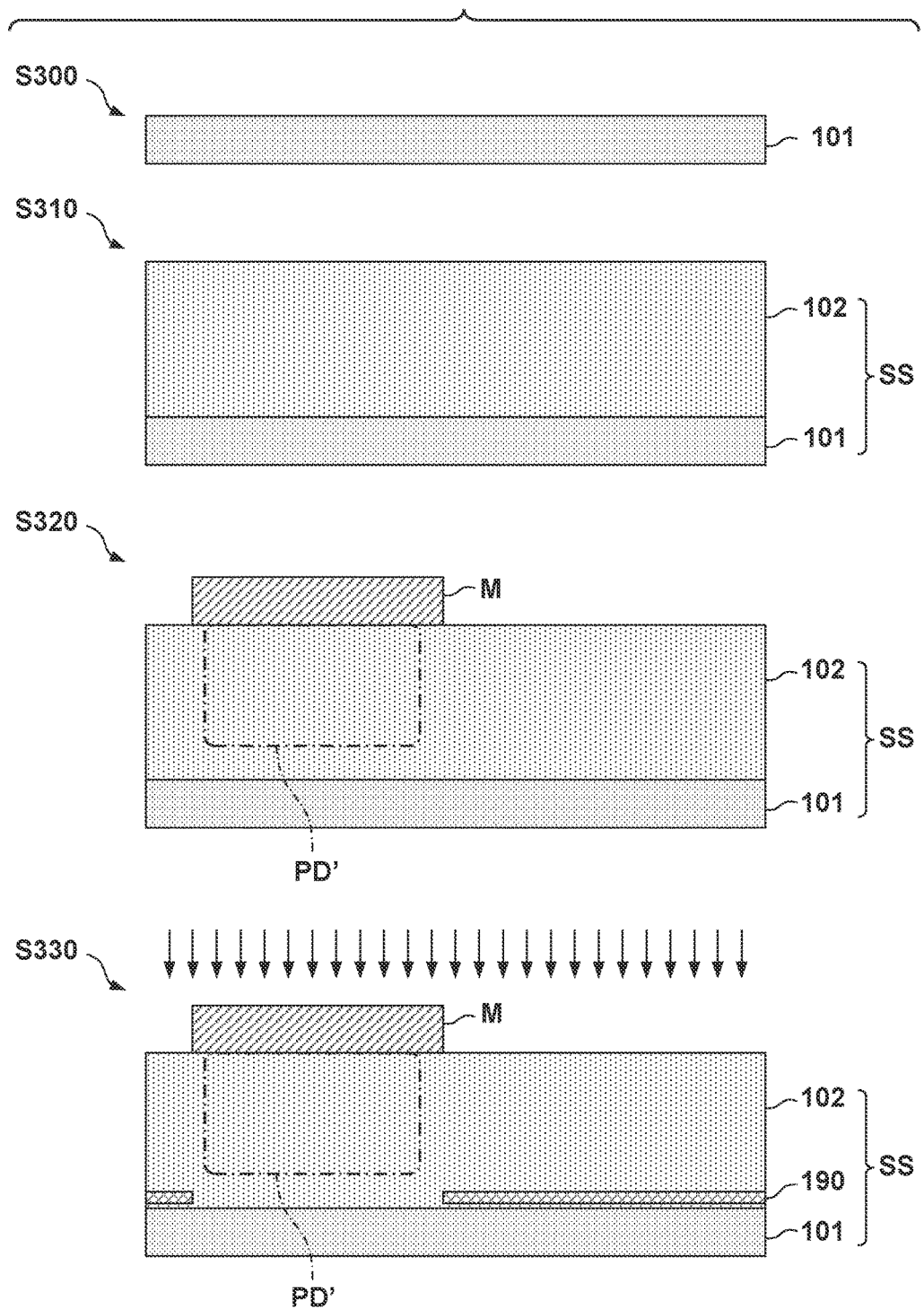
FIG. 11 is a sectional view for explaining a solid-state image sensor and a method of manufacturing the same according to the third embodiment of the present invention.

A solid-state image sensor 100 and a method of manufacturing the same according to the third embodiment of the present invention will be described with reference to FIGS. 11 and 12. Matters that are not mentioned in the third embodiment can comply with the first embodiment. In the third embodiment, an impurity-containing portion 190 is formed by ion implantation after an epitaxial layer serving as a second semiconductor region 102 is formed.

First, in step S300, a single crystal silicon substrate as a first semiconductor region 101 is prepared by mirror-polishing and cleaning a wafer that is sliced from a single crystal silicon ingot pulled by an MCZ method. Then, in step S310, the second semiconductor region 102 (epitaxial layer) is formed on the first semiconductor region 101 by epitaxial growth. Consequently, a semiconductor substrate SS that includes the second semiconductor region 102 is formed on the first semiconductor region 101. Then, in step S320, an ion implantation mask M is formed on the second semiconductor region 102. Note that the mask M can use, for example, a mask made of an organic material such as a photoresist mask. It is preferable, however, that a mask made of an inorganic material such as a metal, ceramics, or glass is used because it can endure a high implantation energy. Although the mask M may contact the semiconductor substrate SS, it is preferably separated from the semiconductor substrate SS especially when the mask made of the inorganic material is used. Then, in step S330, an impurity (a group 14 element except for silicon, for example, carbon or germanium) is implanted in the second semiconductor region 102 via the opening of the mask M, forming the impurity-containing portion 190. The opening of the mask M is formed such that the impurity (the group 14 element except for silicon) is implanted in a region different from a region PD' where a photoelectric converter PD is to be formed.

Subsequently, in step S340, an element isolation portion 110, impurity regions 103, 108, and 109, the photoelectric converter PD, impurity regions 111, 112, and 113, and the like are formed in the semiconductor substrate SS. Then, in step S350, gate electrodes 114 and 115, gate insulating films 116 and 117, insulating layers 118 and 123, the wiring layers 120 and 122, a contact plug 119, a via plug 121, a color filter layer 124, a microlens 125, and the like are formed on the semiconductor substrate SS.

The impurity-containing portion 190 can be arranged at a position apart from a light receiving surface (a portion of a first surface S1 of the semiconductor substrate SS positioned above the photoelectric converter PD) and may be arranged at, for example, the same depth as the photoelectric converter PD. The impurity-containing portion 190 may be formed by implanting an impurity (the group 14 element except for silicon, for example, carbon) selectively under the region PD'.

Figure 13:
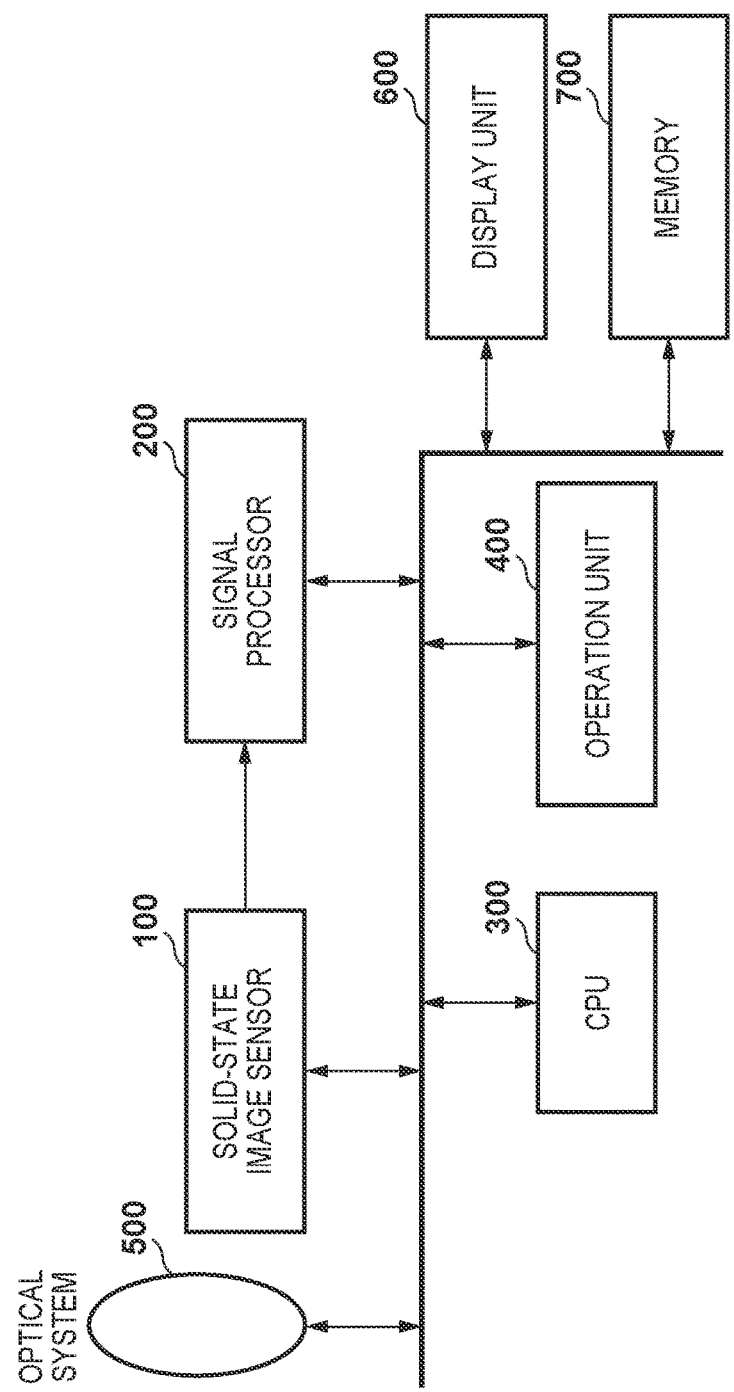
FIG. 13 is a block diagram showing the arrangement of a camera according to an embodiment of the present invention.

FIG. 13 is a block diagram for explaining an example of the arrangement of a camera to which the solid-state image sensor 100 described in the above example is applied. The camera includes, for example, a signal processor 200, a CPU 300 (or a processor), an operation unit 400, and an optical system 500 in addition to the solid-state image sensor 100. The camera can further include a display unit 600 configured to display a still image or a moving image to the user, and a memory 700 configured to store the data. The solid-state image sensor 100 generates image data formed from a digital signal based on light that has passed through the optical system 500. The image data undergoes predetermined image processing by the signal processor 200 and is output to the display unit 600 or the memory 700. In addition, the CPU 300 can change the setting information of each unit or the control method of each unit based on an imaging condition input by the user via the operation unit 400. The concept of the camera includes not only apparatuses mainly aiming at shooting but also apparatuses (for example, a personal computer or a portable terminal) having an auxiliary shooting function.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2016-238781, filed Dec. 8, 2016, which is hereby incorporated by reference herein in its entirety.

What is claimed is:

1. A photoelectric conversion device that includes a silicon substrate,
   wherein the silicon substrate includes a first portion configured to perform photoelectric conversion, and a second portion containing carbon, the second portion being arranged farther apart from a light receiving surface of the silicon substrate than the first portion,
   wherein a carbon peak concentration in the second portion is $1 \times 10^{18}$ [atoms/cm$^3$] to $1 \times 10^{20}$ [atoms/cm$^3$], and
   wherein an oxygen peak concentration in the second portion is $\frac{1}{1000}$ to $\frac{1}{10}$ of the carbon peak concentration.

2. The device according to claim 1, wherein the first portion is arranged between the second portion and the light receiving surface in a direction perpendicular to the light receiving surface.

3. The device according to claim 1, wherein the first portion is arranged in a region in which a carbon concentration is less than an oxygen concentration.

4. The device according to claim 1, wherein a position at which the silicon substrate indicates the carbon peak concentration is arranged such that a distance from the light receiving surface is 3 μm to 20 μm.

5. The device according to claim 1, wherein the second portion includes a first region with a carbon concentration of not less than $1 \times 10^{18}$ [atoms/cm$^3$], and a dimension of the first region in a direction perpendicular to the light receiving surface is not more than 3 μm.

6. The device according to claim 1, wherein the second portion includes a second region with a carbon concentration of not less than $1 \times 10^{19}$ [atoms/cm$^3$], and an oxygen concentration in the second region is not more than $3 \times 10^{18}$ [atoms/cm$^3$].

7. The device according to claim 1, wherein the second portion includes a third region with a carbon concentration of $1 \times 10^{18}$ [atoms/cm$^3$] to $1 \times 10^{19}$ [atoms/cm$^3$], and an oxygen concentration in the third region is not more than $1 \times 10^{18}$ [atoms/cm$^3$].

8. The device according to claim 1, further comprising a peripheral circuit portion configured to read out a signal from a pixel that includes the first portion,
   wherein the peripheral circuit portion includes a transistor that includes a silicide region, and
   wherein the silicide region contains at least one of nickel and cobalt.

9. The device according to claim 1, wherein the silicon substrate is provided with an element isolation portion formed by an insulator having an STI structure.

10. The device according to claim 1, wherein the first portion includes:

an n-type first impurity region; and
a p-type second impurity region positioned between the first impurity region and the second portion, and
wherein an n-type impurity region is provided between the second impurity region and the second portion.

11. A camera comprising:
a photoelectric conversion device defined in claim 1; and
a processor configured to process image data from the photoelectric conversion device.

12. The device according to claim 1, wherein the silicon substrate indicates the carbon peak concentration at a first depth in the silicon substrate, and indicates the oxygen peak concentration at a second depth in the silicon substrate, and
wherein the first depth is about the same as the second depth.

13. A method of manufacturing a semiconductor substrate, the method comprising:
preparing a silicon plate, which includes an oxygen-containing portion with an oxygen concentration of more than $2 \times 10^{16}$ [atoms/cm$^3$] to less than $8 \times 10^{17}$ [atoms/cm$^3$] and a carbon-containing portion with an oxygen concentration being not more than $3 \times 10^{18}$ [atoms/cm$^3$]; and
forming a silicon layer on the silicon plate so that the carbon-containing portion is arranged between the oxygen-containing portion and the silicon layer,
wherein the semiconductor substrate contains silicon of the silicon plate and silicon of the silicon layer,
wherein a carbon peak concentration in the semiconductor substrate is $1 \times 10^{18}$ [atoms/cm$^3$] to $1 \times 10^{20}$ [atoms/cm$^3$], and
wherein an oxygen peak concentration in the semiconductor substrate is $1/1000$ to $1/10$ of the carbon peak concentration.

14. The method according to claim 13, wherein the preparing of the silicon plate includes implanting carbon in a silicon wafer with an oxygen concentration of $2 \times 10^{16}$ [atoms/cm$^3$] to less than $8 \times 10^{17}$ [atoms/cm$^3$], and
wherein the silicon plate contains silicon of the silicon wafer.

15. The method according to claim 14, wherein the implanting the carbon is performed by accelerating and implanting carbon ions with an acceleration energy of 10 KeV to 200 KeV.

16. The method according to claim 14, wherein the implanting the carbon is performed such that a dose of the carbon is more than $1 \times 10^{14}$ [atoms/cm$^2$] to less than $5 \times 10^{15}$ [atoms/cm$^2$].

17. The method according to claim 14, wherein in the implanting carbon, a mask having an opening is used, and carbon is implanted via the opening.

18. The method according to claim 13, wherein the preparing of the silicon plate includes forming a single crystal silicon ingot by an MCZ method, and forming a silicon wafer by slicing the single crystal silicon ingot, and
wherein the silicon plate contains silicon of the silicon wafer.

19. A method of manufacturing a photoelectric conversion device, the method comprising:
preparing a silicon substrate, the silicon substrate including a first semiconductor region and a second semiconductor region arranged on the first semiconductor region; and
forming a photoelectric converter in the second semiconductor region,
wherein a carbon peak concentration in the first semiconductor region is $1 \times 10^{18}$ [atoms/cm$^3$] to $1 \times 10^{20}$ [atoms/cm$^3$], and
wherein an oxygen peak concentration in the first semiconductor region is $1/1000$ to $1/10$ of the carbon peak concentration.

20. The method according to claim 19, wherein the first semiconductor region includes an oxygen-containing portion with an oxygen concentration of more than $2 \times 10^{16}$ [atoms/cm$^3$] to less than $8 \times 10^{17}$ [atoms/cm$^3$].

21. The method according to claim 20, further comprising forming, in the second semiconductor region, a transistor of a peripheral circuit portion configured to read out a signal from a pixel that includes the photoelectric converter,
wherein the transistor includes a silicide region, and
wherein the silicide region contains at least one of nickel and cobalt.

22. A photoelectric conversion device comprising:
a silicon substrate in which a photoelectric converter is arranged; and
a gate electrode of a transistor arranged on a surface of the silicon substrate,
wherein a carbon concentration at a position in silicon substrate, the position being farther apart from the surface of the silicon substrate than the photoelectric converter, is $1 \times 10^{18}$ [atoms/cm$^3$] to $1 \times 10^{20}$ [atoms/cm$^3$], and
wherein an oxygen concentration at the position is $1/1000$ to $1/10$ of the carbon concentration at the position.

23. The device according to claim 22, wherein the carbon concentration at the position is not less than $1 \times 10^{19}$ [atoms/cm$^3$].

24. The device according to claim 23, wherein the carbon concentration at the position is not less than $1 \times 10^{18}$ [atoms/cm$^3$].

25. The device according to claim 22, wherein the silicon substrate includes a region with an oxygen concentration of more than $2 \times 10^{16}$ [atoms/cm$^3$] to less than $8 \times 10^{17}$ [atoms/cm$^3$], and
wherein the region is arranged farther apart from the surface of the silicon substrate than the position.

26. The device according to claim 25, wherein the oxygen concentration of the region is less than $2 \times 10^{17}$ [atoms/cm$^3$].

27. The device according to claim 25, wherein the oxygen concentration of the region is more than a carbon concentration of the region.

28. The device according to claim 22, wherein the transistor includes a silicide region, which contains at least one of nickel and cobalt.

29. The device according to claim 22, wherein a distance between the surface and the position is 6 μm to 12 μm.

30. A camera comprising:
a photoelectric conversion device defined in claim 22; and
a processor configured to process image data from the photoelectric conversion device.

* * * * *